(12) United States Patent
Jha et al.

(10) Patent No.: US 6,392,925 B2
(45) Date of Patent: May 21, 2002

(54) MOBILE COMMUNICATION DEVICE HAVING INTEGRATED EMBEDDED FLASH AND SRAM MEMORY

(75) Inventors: Sanjay Jha; Stephen Simmonds, both of San Diego; Jalal Elhusseini, Poway; Nicholas K. Yu; Safi Khan, both of San Diego, all of CA (US)

(73) Assignee: QualComm, Incorporated, San Diego, CA (US)

( * ) Notice: Subject to any disclaimer, the term of this patent is extended or adjusted under 35 U.S.C. 154(b) by 0 days.

(21) Appl. No.: 09/818,186

(22) Filed: Mar. 26, 2001

Related U.S. Application Data

(62) Division of application No. 09/465,665, filed on Dec. 17, 1999.

(51) Int. Cl.[7] .................................................. G11C 7/00
(52) U.S. Cl. .............................. 365/185.04; 365/185.11; 365/230.03; 713/2
(58) Field of Search ....................... 365/185.11, 230.03, 365/185.04; 713/2, 100, 170

(56) References Cited

U.S. PATENT DOCUMENTS 5,463,766 A * 10/1995 Schieve et al. ............. 395/650
5,822,244 A    10/1998 Hansen et al. ......... 365/185.11
6,205,548 B1 *  3/2001 Hasbun ........................ 713/2

FOREIGN PATENT DOCUMENTS

| EP | 0386935 | 9/1990 | ........... G06F/13/42 |
| EP | 0905704 | 3/1999 | ............ G11C/8/00 |
| FR | 2719939 | 5/1994 | ............ G11C/8/00 |
| WO | 9812704 | 3/1998 | |
| WO | 9933057 | 7/1999 | ............ G11C/7/00 |
| WO | 9935649 | 7/1999 | ............ G11C/8/00 |
| WO | 9935650 | 7/1999 | ........... G11C/16/04 |

* cited by examiner

Primary Examiner—Son T. Dinh
(74) Attorney, Agent, or Firm—Philip R. Wadsworth; Charles D. Brown; Howard Seo

(57) ABSTRACT

The flash and SRAM memory are embedded within an application specific integrated circuit (ASIC) to provide improved access times and also reduce overall power consumption of a mobile telephone employing the ASIC. The flash memory system includes a flash memory array configured to provide a set of individual flash macros and a flash memory controller for accessing the flash macros. The flash memory controller includes a read while writing unit for writing to one of the flash macros while simultaneously reading from another of the flash macros. By permitting read while writing, read operations need not be deferred until completion of pending write operations. The flash memory controller also includes programmable wait state registers. Each wait state register stores a programmable number of flash bus wait states associated with a portion of the flash memory. Thus, portions of flash memory subject to flash memory degradation may be programmed with a higher number of wait states than portions of memory that are not subject to degradation.

2 Claims, 5 Drawing Sheets

| FLASH MACRO | CURRENT FLASH MACRO STATUS |
|---|---|
| FLASH MACRO #1 | READ OPERATION IN PROGRESS |
| FLASH MACRO #2 | NOT IN USE |
| FLASH MACRO #3 | NOT IN USE |
| FLASH MACRO #4 | WRITE OPERATION IN PROGRESS |
| ⋮ | |
| FLASH MACRO #N | NOT IN USE |

STATUS REGISTER

MOBILE COMMUNICATION DEVICE HAVING INTEGRATED EMBEDDED FLASH AND SRAM MEMORY

This application is a divisional of Ser. No. 09/465,665, filed on Dec. 17, 1999, now pending.

FIELD OF THE INVENTION

The invention generally relates to mobile communication devices such as cellular telephones and in particular to flash memory and static random access memory (SRAM) for use therein.

DESCRIPTION OF THE RELATED ART

A flash memory is a type of non-volatile memory that retains stored information even after power is disconnected. This is in contrast with volatile memory devices, such as SRAM or dynamic RAM (DRAM), which lose data stored therein once power has been disconnected. In addition to being non-volatile, flash memory is electrically erasable and reprogrammable within the system in which it is incorporated. This is in contrast with other non-volatile memory devices, such as erasable, programmable read-only memory (EPROM) which typically requires special voltages for reprogramming and, hence, is typically only reprogrammable by a manufacturer or service specialist.

Accordingly, flash memory is advantageously employed within devices requiring non-volatile memory that can be selectively erased and reprogrammed. In particular, flash memory is well-suited for use in desktop personal computers, laptop computers, video game cartridges, digital voice recorders, personal digital assistants (PDAs), and cellular telephones (or other mobile stations of wireless communication systems). Typically, within such systems, the flash memory is configured as a single flash macro, which can either be written to or read from, but not both, at any given time. For most devices this is sufficient. For example, within most devices containing flash memory, any data to be stored within the flash memory is stored within volatile memory until the device is to be shut off, then the flash memory is reprogrammed with the data during a shut-down operation. As such, it is unlikely that the device will ever need to both read from and write to the flash memory at the same time. As one example, a PC or laptop computer may store changes to a basic input/output system (BIOS) within a DRAM memory until the computer is to be shut down, then the changes to the BIOS are transferred to flash memory.

Problems, however, arise when attempting to implement flash memory within a cellular telephone which may require many more frequent read operations and write operations to the flash memory. Cellular telephones consume a considerable amount of power during use and, to be commercially desirable, the cellular telephone must be able to operate effectively for long periods of time between recharging. As a result, cellular telephones are typically configured to shut down power to internal components as often as possible. Within CDMA cellular telephones, for example, many components are powered down between each successive paging slot of the CDMA system. (The paging slots occur 30 milliseconds apart.) Accordingly, it is not feasible to accumulate pending write operations within a non-volatile memory until a single final power shut-down operation. Rather, data to be written to the flash memory may need to be written promptly prior to each successive temporary power shut-down. Moreover, the need to frequently reprogram the flash memory is typically much greater within a cellular telephone, particularly within a cellular smart phone, i.e., a cellular telephone configured with a PDA to thereby provide both cellular telephony functions and PDA functions. Insofar as computers are concerned, a flash memory may only need to be reprogrammed in the event there are changes to the BIOS or other configuration parameters of the system. With a cellular smart phone, the flash memory may need to be frequently reprogrammed to record new telephone numbers, addresses, calendar dates, meeting dates and the like. For smart phones configured to record voice memos, the flash memory may need to be reprogrammed whenever the uses of the telephone records a voice memo. Accordingly, reading and writing operations may need to be performed much more frequently in connection with cellular telephones and the conventional flash memory arrangement, whereby reading from and writing to the flash memory cannot be performed simultaneously, may be inadequate.

Moreover, within cellular telephone applications, the flash memory may need to be accessed much more quickly than is required in other applications. This is particularly true if the data to be retrieved from the flash memory is required for use in connection with any real time functions of the cellular telephone, such as voice telephone calls. For such functions, any delay necessitated by having to wait for a previous write operation to be completed before reading from the flash memory may be significant.

Furthermore, even if a read operation need not be delayed pending completion of a write operation, read times within conventional flash memories can be fairly slow. Flash memories become degraded with use such that the read time for particular flash cells that have been frequently rewritten become slow in comparison with flash cells that have not been frequently rewritten. Hence, after a device containing flash memory has been used for some time, some of the flash cells have slower read times than others. To account for possible degradation, devices containing flash cells typically set an internal flash memory read time to be relatively slow. In this regard, a bus system connected to the flash memory for retrieving data from the flash memory is pre-programmed with a number of wait states sufficient to account for the potentially slow access times of cells that may become degraded. In other words, the bus system is pre-programmed to accommodate the worst case scenario insofar as flash memory access time is concerned. As a result, all read accesses are relatively slow, even from flash memory locations which have not yet been degraded. In many devices, the slow read time is not problematic. However, in connection in with cellular telephones, it is much more important to minimize the time required for each access from flash memory, particularly while the cellular telephone is engaged in real time functions. Accordingly, it would be highly desirable to provide an improve flash memory system, particularly for use within cellular telephones or similar devices which overcome the disadvantages set forth above. It is to this end that aspects of the present invention are directed.

Typically, within cellular telephones, a flash memory is used in conjunction with an SRAM, wherein the flash memory provides for non-volatile storage and the SRAM provides for volatile storage. Typically, the flash memory and SRAM devices are separate devices from one another and are also mounted separately from a primary ASIC of the cellular telephone which includes the microprocessor and the various peripheral components for handling cellular telephony functions. In such implementations, because of the flash and the SRAM memories are separate from the ASIC, the time required to access the flash memory and the SRAM can be relatively slow, thus, hindering overall system performance. Accordingly, it is also desirable to provide an improved system architecture for use within cellular telephones having flash memory, SRAM and a central ASIC which permits expedited access to the flash and SRAM memories and it is to this end that other aspects of the invention are directed.

Also, because the flash memory of the cellular telephone may need to be accessed frequently, there is a risk that portions of data stored within the flash memory may be inadvertently overwritten. This is particularly true in state-of-the-art cellular telephones which may include the numerous hardware components each capable of reprogramming portions of the flash memory. This problem is exacerbated by the fact that a software for use within cellular telephones typically must be developed and brought to market very quickly to accommodate the fast-changing marketplace. As a result, there is a fairly significant risk that software may inadvertently cause portions of data within the flash memory to be re-written or erased. This can be a serious problem if the portion of flash memory inadvertently erased stored important telephone numbers, such as police numbers, fire department numbers and the like or stored important software programs, such as boot loaders and the like required for operation of the telephone. Accordingly, it is highly desirable to provide an improved flash memory system which minimizes the risk of inadvertent erasure of portions of the flash memory and still further aspects of the invention are directed to this end.

SUMMARY OF THE INVENTION

In accordance with a first aspect of the invention, a flash memory system is provided with a read while writing means for writing to one of the flash macros while simultaneously reading from another of the flash macros. In one specific example, wherein the flash memory system is connected to a microprocessor, the read while writing means includes means for writing signals received from the microprocessor to a selected one of the flash macros and means, responsive to receipt of a read command from the microprocessor directed to the selected flash macro, for suspending operation of the microprocessor until the means for writing has completed its operation, then performing the read command.

Thus, the flash memory cells are divided into a set of flash macros which can be independently accessed. A write operation can be performed to one of the flash macros while a read operation is performed within another of the flash macros. This improves the overall system response time, in part because read operations need not be deferred until a write operation is completed. Indeed, since flash memory write operations typically take much longer than flash memory read operations, numerous read operations may be performed in parallel during a single flash memory write operation.

In accordance with a second aspect of the invention, a flash memory system is provided with programmable wait states. In an exemplary embodiment, flash memory cells are again arranged as a set of flash macros. A flash memory bus interconnects the flash macros and a flash memory controller. The flash memory controller includes a wait state register unit for storing a programmable number of wait states associated with the flash macros, with one programmable number of wait states per flash macro. The flash memory controller also includes a flash macro access unit for accessing a selected flash macro. Flash macro access unit accesses the selected flash macro using the flash memory bus program with the number of wait states associated with the selected flash macro. With this arrangement, portions of the flash memory which are frequently reprogrammed, and hence subject to degradation, can be accessed using a greater number of wait states than other portions of the flash memory. As a result, portions of the flash memory which are not frequently reprogrammed can be accessed much more quickly than within systems wherein all the read operations to the flash memory are delayed by some number of wait states to accommodate a worse case memory access time corresponding to a worse case amount of degradation.

In accordance with a third aspect of the invention, a flash memory system is provided with password protection. In an exemplary embodiment, the flash memory system includes flash memory cells arranged as a set of flash macros along with a flash memory controller having means for storing a separate password associated with each flash macro and the means, responsive to receipt of a valid password from a selected one of the flash macros, for enabling programming for erasing of flash cells of the selected flash macro while simultaneously preventing programming for erasing of all other flash cells. With this configuration, the risk of inadvertent erasure of the portions of the flash memory is greatly minimized. A valid password is acquired before an erasure operation can be performed. Hence, inadvertent erase operations resulting from software bugs and the like are greatly reduced. Moreover, by providing different passwords for different portions of the flash memory, individual computer programs or individual peripheral hardware components can be restricted to only erasing particular portions of the flash memory. As a result, the risks of inadvertent erasure or reprogramming of large portions of the flash memory is greatly reduced. In a specific implementation, a portion of the flash memory stores a boot loader for use in booting a system in which the flash memory resides. A separate password associated with the boot loader is provided to further minimize the risk of accidental reprogramming of the boot loader.

In accordance with a fourth aspect of the invention, a flash memory system is provided with a programmable memory map. Flash memory system includes flash memory cells and a flash memory controller provided with means for partitioning the flash memory cells into high and low memory locations. The flash memory cells store a boot loader beginning at a lowest memory address of the flash memory space. The means for partitioning includes the means for swapping the high and low memory locations after operations performed by the boot loader have been completed. With this arrangement, the boot loader, which is typically only accessed during an initial power-up operation, is swapped into high memory such that other data and programs which may need to be accessed more frequently can be stored within low memory where they can be accessed more expediently.

Other objects, features and advantages of the invention will be apparent from the descriptions which follow in conjunction with the attached drawings. Method and apparatus embodiments of the invention are provided.

BRIEF DESCRIPTION OF THE DRAWINGS

FIG. 5 is a block diagram of a flash memory status register for use with the flash memory system of FIG. 2.

DETAILED DESCRIPTION OF EXEMPLARY EMBODIMENTS

With reference to the figures, preferred and exemplary embodiments of the invention will now be described. The invention will primarily be described with reference to an integrated embedded flash and SRAM system for use within a voice and data modem ASIC of a CDMA cellular telephone. However, the principles of the invention are applicable to other systems as well.

Figure 1:
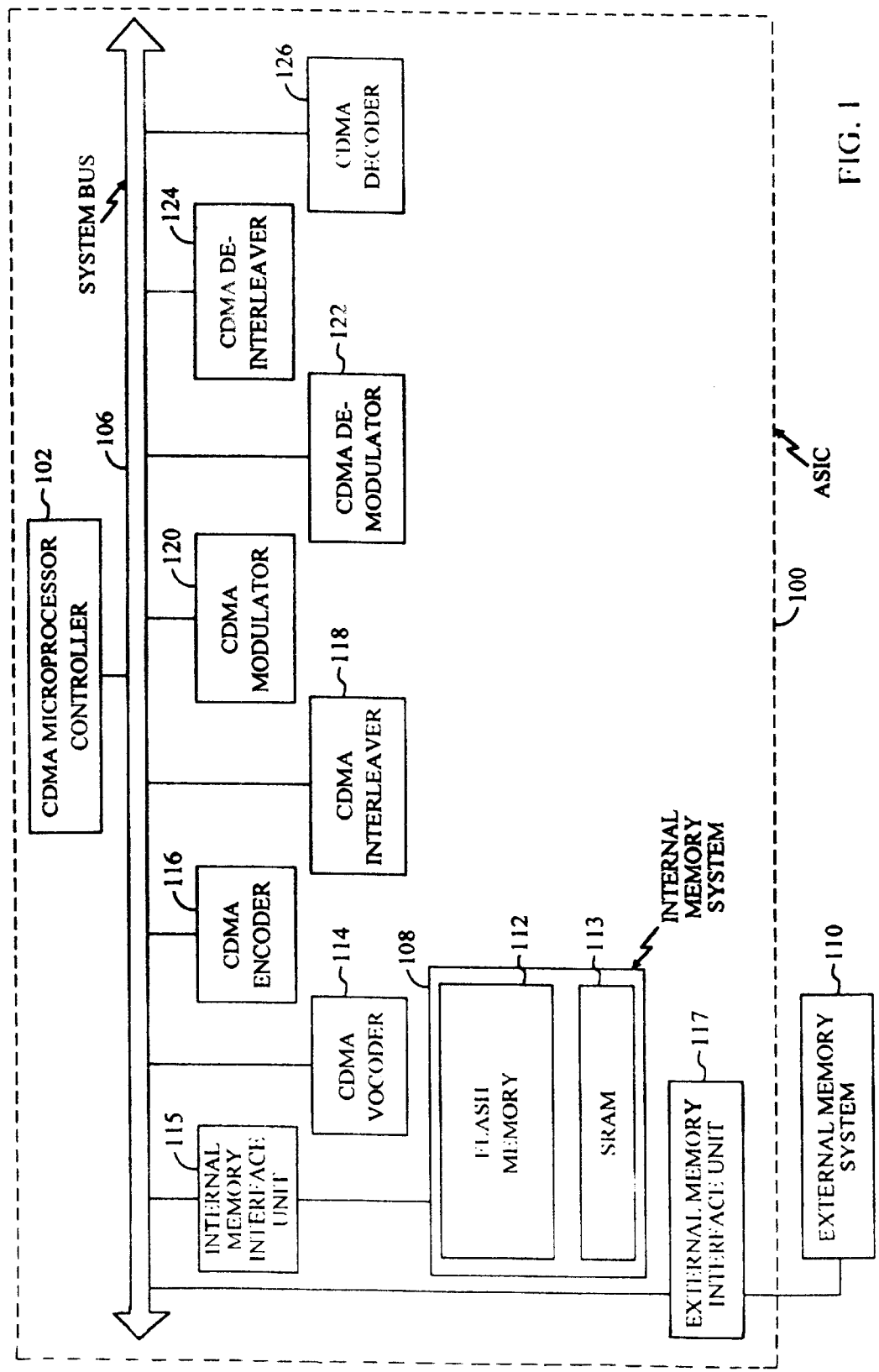
FIG. 1 is a block diagram of a voice and data modem ASIC having an integrated embedded flash and SRAM memory system for use within a mobile telephone.

FIG. 1 illustrates a voice and data modem ASIC 100 for use within a mobile wireless communications device such as a cellular telephone configured for use within a CDMA wireless communication system. The voice and data modem ASIC includes circuitry for handling telephony functions of the cellular telephone. Although not shown, the cellular telephone may include other ASIC=s or other integrated circuits configured to perform other functions. For example, if the cellular telephone is configured as a smart phone to provide PDA functions as well as wireless telephony functions, a separate ASIC may be provided for controlling the PDA functions. Alternatively, all functions may be integrated within a single ASIC.

To handle the wireless telephony functions of the cellular telephone, ASIC includes a microprocessor 102 for controlling the voice and data modem functions. The microprocessor may be, for example, a reduced instruction set computing (RISC) microprocessor, such as the ARM 7TDMIJ microprocessor provided by Arm, IncJ. ARM 7TDMI and Arm, Inc. are both trademarks of Arm, Inc. In other implementations, other microprocessors are employed including, for example, complex instruction set computing (CISC) microprocessors. Various peripheral components, generally denoted 104, are provided within the ASIC for performing specific CDMA wireless telephony functions.

A system bus 106 interconnects the microprocessor and the various CDMA peripheral components. In use, the microprocessor controls the various CDMA peripheral components, via the system bus, to perform various functions directed to processing CDMA wireless communications such as converting CDMA signals received from a base station (not shown) into voice signals for outputting through a speaker of the cellular telephone or converting voice signals received from a microphone of the cellular telephone into CDMA signals for transmission to the base station. To perform these and other functions, the microprocessor and the peripheral components store data or other information within either an internal memory system 108 formed on the ASIC or within an external memory system 110, which may comprise one or more SRAM, DRAM or flash memory chips mounted within the cellular telephone external to the ASIC. In general, data or other information that needs to be accessed quickly, such as data used in connection with real time processing of telephone calls and the like, is stored within the internal memory system for expedient access. Data that does not need to be retrieved as quickly, such as data for use with non-real time functions, is stored within the external memory system.

The internal memory system includes a flash memory system 112 and an SRAM 113 integrated as a single memory system. In the exemplary implementation of FIG. 1, the circuits of the single memory system and the circuits of the microprocessor and CDMA peripheral components are all integrated onto a single silicon die. In other implementations, the circuits of the single memory system are provided on one die and the microprocessor and peripheral CDMA components are provided on another die. Preferably, in that implementation, the two separate silicon die are integrated within a single chip. In any case, an internal memory interface unit 115 interconnects the internal memory system with the microprocessor and the peripheral CDMA components via a system bus 106. An external memory interface unit 117 interconnects the external memory system with the microprocessor and the peripheral CDMA components also via system bus 106.

The flash memory of flash memory system 112 of the internal memory system is used primarily for storing CDMA software code for use by the microprocessor or the CDMA peripheral components. Typically, the flash memory also includes a boot loader which is retrieved and run during an initial power-up operation by the microprocessor. The boot loader includes instructions for accessing and running other CDMA programs stored within the flash memory. The flash memory is also employed for providing non-volatile storage of data used in connection with the cellular telephone, such as storage of names, telephone numbers, addresses and the like. If the cellular telephone is configured as a smart phone to additionally perform the operations of a PDA, then the flash memory additionally stores data used by the PDA, such as meeting dates, calenders, schedules, voice memos, and the like. In general, any type of software or data which much be retained even while the cellular telephone is completed powered down is preferably stored within either the flash memory system embedded within ASIC or within the flash memory system, if any, provided within the external memory.

Embedded SRAM 113 provides volatile storage of other types of data or software programs employed by the microprocessor or the peripheral components in connection with their functions. For example, as CDMA signals are received from a base station during a cellular telephone conversation, the various peripheral components may store the signals, or processed versions thereof, within the SRAM. As one specific example, after the Viterbi decoder has processed the input signals, the decoded symbols for voice are stored within the SRAM for subsequent processing by the vocoder. The external memory may also be employed as a volatile memory for storing data, particularly data which need not be accessed at high rates.

Now briefly considering the CDMA peripheral components of ASIC 100, for transmission of signals, a vocoder 114 is provided, which may include a DSP, for converting voice signals received through a microphone (not shown) into digitized symbols or other packets of information. A CDMA encoder 116 encodes the symbols generated by the vocoder for error correction and detection purposes. A CDMA interleaver 118 interleaves the encoded signals to provide time diversity to thereby permit a reduction in transmission power. A CDMA modulator 120 modulates the interleaved signals for subsequent transmission via an antenna (not shown). For processing received signals, a CDMA demodulator 122 demodulates the signals, a deinterleaver 124 deinterleaves the signals so as to remove the effect of any previous interleaving, and a CDMA decoder 126 decodes signals to extract voice or data signals encoded therein. For voice communications, the decoded voice signals are output through a speaker (not shown) to the user of the telephone. For data communications, the decoded data signals are further processed by other components of the phone such as, for example, for display (on a display not shown) using a web browser program, email program or the like.

Thus, FIG. 1 illustrates, among other features, an ASIC having an embedded flash and SRAM. By embedding the flash memory and SRAM on the ASIC, the microprocessor and the flash and SRAM memory are thereby physically close to one another. Hence, data bus and control signals from the microprocessor to memory, and vice versa, encounter less routing and capacitance delays as found on printed circuit boards when using off-chip memory. This improves overall memory access time and faster overall processing speeds. Also, by embedding the flash and SRAM within ASIC, the overall size of the electronics of the cellular telephone can be reduced as compared with the systems requiring all memory to be external from the ASIC. This permits the cellular telephone to be configured using a slim and compact design. Furthermore, significant power savings are achieved by embedding the flash memory and SRAM within the ASIC. In particular, if the flash memory and SRAM are provided off-chip, considerable power and energy is consumed toggling various input/output pin s required to access the flash memory and SRAM and signal traces on the printed circuit board. Hence, by storing data and programs that need to be accessed frequently within the embedded flash memory and SRAM, power consumption is reduced, thereby improving the standby time of the cellular telephone, such that the phone can be operated longer by the customer before a recharge operation is required. Also, there is lower overall current consumption when the devices are active thereby further reducing power consumption. Preferably, the system bus, the microprocessor, and the internal memory system are all configured to process 32-bit data paths. External flash and SRAM are typically accessed using only an 8-bit data path. Hence, by accommodating a 32-bit data path access times are also further improved. Moreover, because a greater amount of data can be processed during each clock cycle, the overall clock rates of the components of the ASIC can be reduced, thereby still further improving power consumption. For off-chip memory, 32-bit data path is not typically used because of pin and routing limitations. As yet another advantage, the provision of embedded flash memory and SRAM within the ASIC reduces the total number of chips required on the motherboard of the cellular telephone thereby increasing reliability as a result of simplified manufacturing processes.

Thus, the provision of an embedded flash and SRAM memory within ASIC 100 provides numerous advantages. In the following, specific features of the flash and SRAM memories of the internal memory system will be described in greater detail. These features provide, for example, improved access time, improved protection from inadvertent rewrite operations, or the like.

Figure 2:
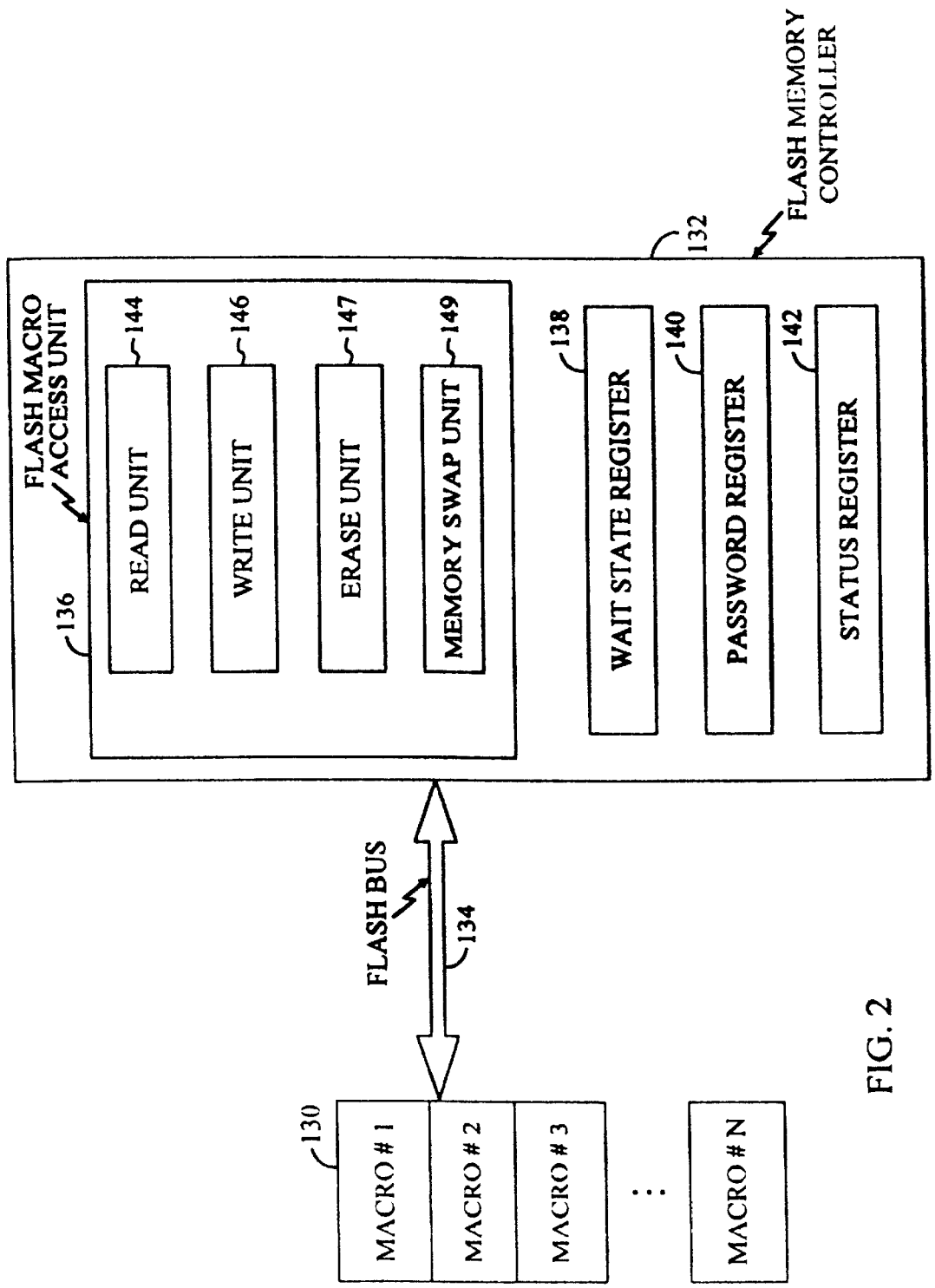
FIG. 2 is a block diagram of a flash memory system of the ASIC of FIG. 1.

Referring now to FIG. 2, the embedded flash memory system includes a flash memory array 130 and a flash memory controller 132. Flash memory array 130 includes flash memory cells defining up to N different flash macros which, as will be described, can be independently accessed. In other words, a read operation can be performed on one of the flash macros while a write operation is performed on another of the flash macros. In a specific example, N is set at 4, permitting the flash memory to be subdivided into a total of four separate flash macros. A flash memory system bus 134 interconnects the flash memory array and the flash controller permitting the flash controller to access the flash memory array to perform read or write operations. Preferably, all three components are configured to accommodate 32-bit data paths. Flash controller 132 includes a flash macro access unit 136 and various memory registers, including a programmable wait state register 138, a programmable password register 140 and a status register 142. The flash memory access unit uses information stored within the various registers to control access to the flash macros of the flash memory array. The information stored within the registers and the manner in which the information is used will be described in greater detail below.

Flash memory access unit 136 includes a flash memory read unit 144 and a flash memory write unit 146. The read unit is used for reading data or software programs stored within the flash memory unit. The write unit is used for reprogramming portions of the flash memory to store new data or new programs. Together, the read and flash write units provide a read while writing means for permitting a read operation to be performed on one of the flash macros while a write operation is simultaneously performed on another one of the flash macros. Thus, as a specific example, read unit 144 may perform a read operation on flash macro #1 while write unit performs a write operation on flash macro #2. A read operation is performed by forwarding a read command over flash bus 134 to flash memory array 130 specifying a particular memory address within the overall memory array. In the case of a read operation from flash macro #1, the address will specify a 32-bit memory address within the address spaces of flash macro #1. Likewise, for a write operation, a write command is forwarded over the flash bus to the flash memory. The write command specifies an address within the flash macro and additionally specifies the data to be stored therein. For a 32-bit data path implementation, the write command will provide 32 bits of data along with the memory address. Also, as will be described below, a write operation is only performed if a correct password is received from the microprocessor or peripheral component as part of the write command.

Flash memory write operations take a substantially greater amount of time than a flash read operation. A read operation, for example, may be performed within only a single clock cycle. A write operation may require hundreds of clock cycles. Accordingly, a very large number of individual read operations may be performed while a single write operation is being performed. Read operations are performed on any of the flash macros other than the macro subject to the write operation. If a read request is received from the microprocessor specifying an address within the flash macro being currently subject to a write operation, the read operation is deferred by the flash macro access unit until the write operation has completed. Additionally, the flash memory access unit forwards a signal to the microprocessor controlling the processor to suspend operation pending completion of the write operation. This may be achieved using an interrupt signal or other conventional technique. In other implementations, such as in an implementation employing a microprocessor capable of a speculative processing, it may be desirable to permit the microprocessor to continue to operate while the write operation is performed.

Hence, a read while write mechanism is provided. The read while write mechanism permits faster read access times to be achieved, on the average, because read operations need not be deferred until completion of a pending write operation unless issued to the same flash macro. As such, the overall system is more efficient, either permitting the system to perform more operations within a given period of time or permitting the system to be run at a generally lower clock rate, thus reducing power consumption.

The flash memory access unit additionally includes an erase unit 147 for erasing portions of the flash memory. The erase unit receives an erase command from the microprocessor or other component specifying a beginning address and further specifying the amount of data to be erased. The erase to the command may specify erasure of either a single word (32 bits), an entire page, or the entire flash memory array. As with write operations, an erase operation is only performed if a correct password is received from the microprocessor or peripheral component as part of the erase command. During an operation wherein the entire flash memory array is erased, referred to herein as a "mass erase" operation, all other read or write requests to the flash memory are stalled pending completion of the mass erase operation. In the exemplary implementation, all flash memory operations are also stalled when a page of the flash memory is erased, even if the operation is to be performed to a flash macro separate from the page being erased. In other implementations, flash memory operations are permitted to other flash macros not affected by the page being erased. Also, depending upon the specific implementation of the flash memory, an erase By operation may need to be performed prior to any write (or program) operation. More specifically, if the flash memory is configured such that a write operation can only cause a "one" bit to change to a "zero" bit, then an erase operation will need to be performed to the word or words being written to prior to the actual write operation. The erase operation converts all bits previously programmed to "zero" back to "one", such that the subsequent write operation can reprogram selected bits within the word to "zero". Accordingly, in such an implementation, flash memory write unit 146, upon receiving a write command, first controls erase unit 147 to erase the word or words subject to the write operation before performing the write operation. In the alternative, write unit 146 does not automatically perform an erase operation prior to a write operation. In such implementation, software designers must ensure that software accessing the flash memory performs erase operations prior to write operations.

The flash memory access unit also includes a memory swap unit 149 for use in swapping high and low memory portions of the overall memory address phase of memory array 130. The operation of the memory swap unit will be described in greater detail below in connection with FIG. 5.

Figures 3, 4:
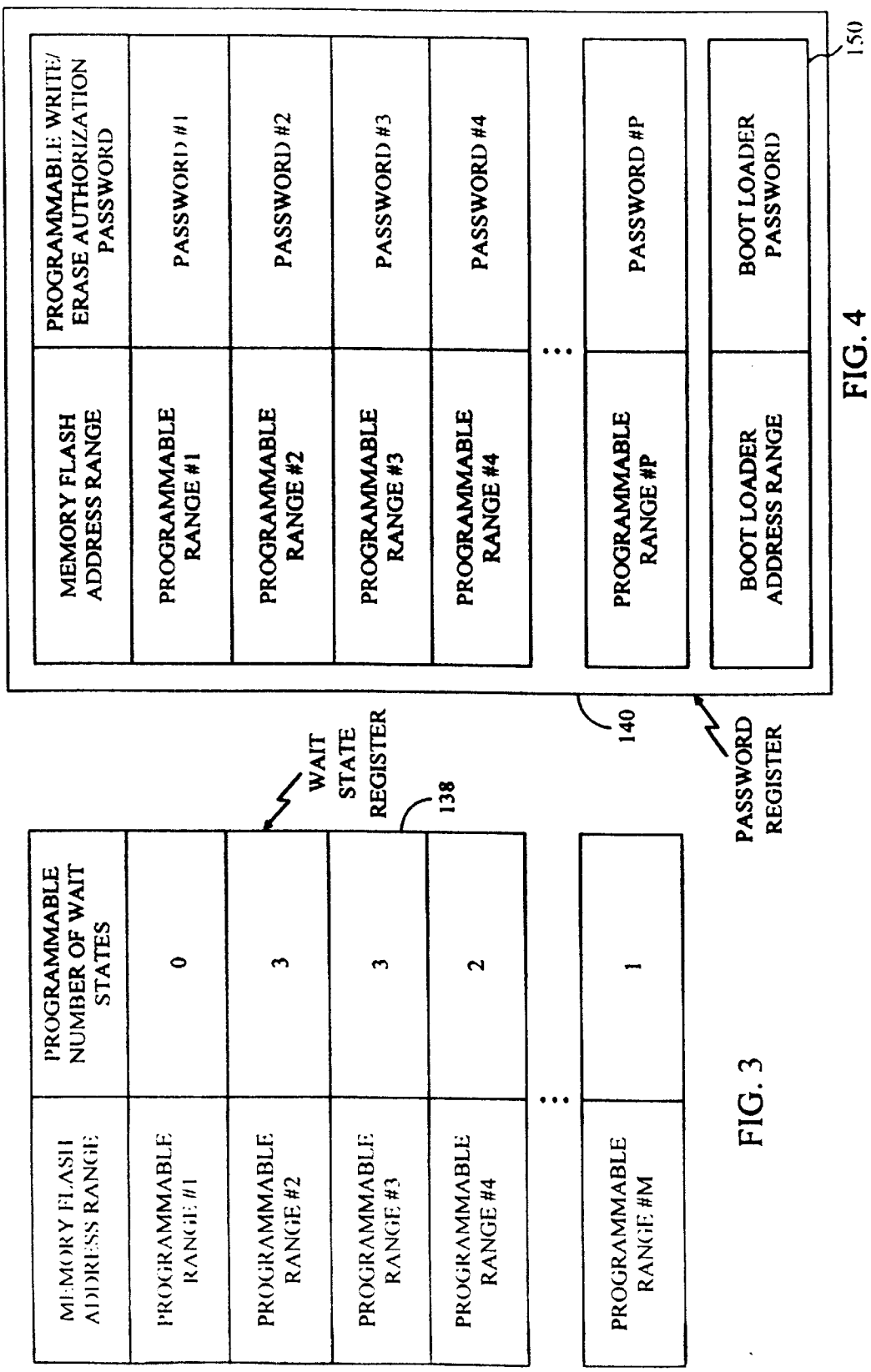
FIG. 3 is a block diagram of a wait state memory for use within the flash memory system of FIG. 2.
FIG. 4 is a block diagram of password memory for use within the flash memory system of FIG. 2.

FIG. 3 illustrates wait state memory register 138 for flash bus wait states for use with different portions of the flash memory array. The wait state memory register includes M separate storage registers for storing wait state values associated with M separate portions of the flash memory array. In one implementation, M is set to N such that there is one separate wait state register per flash macro. In other implementations, there may be multiple wait state registers per flash macro or multiple flash macros per wait state register. In one specific implementation, N is set to four and M is set to 16. Each wait state register stores a wait state value for use during read operations to any memory address within a corresponding portion of the memory array. The wait state specifies the number of cycles of the flash memory bus that the flash memory access unit must wait until retrieval of data via a read operation. If the wait state is set to zero, then the flash memory access unit accesses the flash bus during the clock cycle immediately subsequent to a clock cycle in which a read operation was asserted to the flash array. If the wait state is set to 3, then the flash memory access unit waits three clock cycles subsequent to the assertion of a read operation.

Different wait state values can be provided for different portions of flash memory array to accommodate differing degrees of degradation of the flash memory arrays. Briefly, the more often a flash cell is written to, the slower the flash cell responds to subsequent read operations. With different portions of the flash array storing different types of data or programs, different degrees of read time degradation occur. More specifically, portions of the flash memory that are frequently rewritten, such as portions used to store voice memos, are subject to a greater amount of degradation than portions of flash memory that are re-written infrequently, such as portions storing the boot loader. (In an implementation described below, the boot loader is swapped in and out of high memory resulting in some degree of degradation to the memory cells used to store the boot loader.)

Thus, a separate wait state value is stored within the wait state register for each portion of memory depending upon the degree of expected degradation of that memory. For portions of memory that are expected to be re-programmed only infrequently, a wait state of zero is pre-programmed within the corresponding wait state memory register. For portions of the array that are expected to be reprogrammed frequently, a wait state value of 3 is preferably pre-programmed. The amount of re-programming that is expected is determined in advance based upon the overall system hardware and software design. Thus, if certain hardware and software components that frequently write to flash memory, such as voice memo components, are designed to use only flash macro #3, then the wait state for flash macro #3 is pre-set to 3. Alternatively, a wait state of 0 is pre-set for flash macro #1; a wait state of 1 is pre-set for flash macro #2; a wait state of 2 is pre-set for flash macro #3 and so on. Software and hardware designers are instructed to design systems to write to the flash macros based upon the expected write frequency. Designers developing hardware or software that make frequent writes to flash memory will configure their systems to write to flash macro #4. Designers developing hardware or software that writes to flash memory only infrequently will configure their systems to write to flash macro #1. As yet another alternative, the flash memory access unit is configured to track the number of write operations performed to each flash macro and to selectively increase the number of wait states associated accordingly. The wait state registers are all preset to zero when the cellular telephone is initially manufactured. Thereafter, depending upon the extent to which different flash macros are rewritten during the use of the cellular telephone, the individual values stored within the wait state registers are selectively reset to 1, then perhaps 2, then 3 or more. Depending upon the particular flash memory used, and upon the amount of usage of the cellular telephone, it may be a year or two before any of the wait state registers are reset from zero to 1 and none may ever reach a wait state value of 3. In other cases, the values may need to be reset more frequently. In still other implementations, an even greater number of wait state values are provided including, for example, wait state values from zero to 10. The total number of wait state values and the number of re-programming operations performed before the number of wait states is increased depends greatly upon the particular flash memory array, the flash bus, and the flash controller as well as the overall frequency of the clock used to control the various components. However, for each choice of components and for each choice of clock signal, routine experimentation may be performed to determine acceptable or optimal values for the wait state values and to determine how frequently the wait state values need to be incremented. In any case, by providing programmable wait state values, average memory access times can be reduced thereby providing for either greater processing speed or permitting use of a slower clock to achieve similar processing speeds.

FIG. 4 illustrates flash memory password register 140 for storing passwords associated with different portions of the flash memory array. The flash memory password register stores P passwords, each one associated with a corresponding portion of the flash memory array. In one example, P is set to 16. For ease of programming, P may be set to the same value of M. Each individual password register stores a unique password required before a write or erase operation can be performed to the corresponding portion of the memory array. Thus, each write command received from the microprocessor or other component of the ASIC specifies a password, along with a memory address and the data to be written to that address. Each erase command also specifies a password, along with an identification of the memory addresses to be erased. Upon receipt of a write command, write unit 146 (FIG. 2) compares the password received within the write command with the password stored within the password register for the memory address specified by the write command. If the passwords match, the write unit proceeds to perform the write command by forwarding the write operation to the flash memory. If the passwords do not match, the write unit forwards an error signal back to the component issuing the write command informing the component that the write command could not be performed because of an invalid password. Erase commands are handled n the same manner.

Thus, password protection is provided. Password protection is provided, in part, to prevent inadvertent erasure or reprogramming of portions of the flash memory, perhaps as a result of a software bug or the like. In this regard, it is fairly unlikely that an inadvertent write or erase command would include the correct password. Also, if the overall system is configured such that different peripheral components read and write to different portions of flash memory, then password protection also helps prevent one peripheral component from inadvertently writing into a memory area reserved for another component. For example, the vocoder may read or write only from flash macro #2. Other password protocols may be alternatively provided. For example, rather than associating a different password with different portions of memory, different passwords may be directly associated with different issuing components. Thus, for example, a first password may be associated with commands received from the microprocessor, whereas a second password is associated with commands received from the vocoder. In this implementation, each device can potentially read to or write from any of the flash macros, but the risk of inadvertent write operations is minimized nevertheless. Each password may be, for example, a unique binary sequence of 16 bits. By providing password protection, the loss of important data is avoided, such as loss of phone numbers for police, fire or the like. Also, the risk that portions of the CDMA code stored within the flash memory might be corrupted is reduced. In an extreme case, corruption of one or more of the CDMA programs stored within the flash memory could result in failure of the overall cellular telephone, requiring the customer to return the cellular telephone for replacement or service. In still other implementations, the user may be able to record particular passwords for use with data stored by the user. For example, if one of the flash macros is used exclusively for storing voice memos, the user may input a unique password via the keypad of the cellular telephone preventing unauthorized access to the voice memo by another user of the telephone. Likewise, particular portions of memory for storing phone numbers, addresses and the like may have a user-entered a password associated therewith to prevent unauthorized access as well. As can be appreciated, a wide variety of different password scenarios may be provided consistent with the general principles of the invention.

As noted, a portion of the flash memory array may be employed to store a boot loader. A separate additional password register 150 is provided for the portion of memory storing the boot loader. Hence, no write or erase command affecting the portion of memory storing the boot loader is performed unless that command additionally provides the separate boot loader password. This, therefore, provides an additional level of password protection to the critical boot loader for minimizing risk that the boot loader will be inadvertently corrupted.

FIG. 5 illustrates flash memory status register 142 for storing the status of the flash macros of the flash memory array. The status register includes N individual memory elements for separately storing the status of each of the N flash macros. Each status register specifies, among other possible features, whether the corresponding flash macro is subject to a current pending read or write operation. Additionally, the status register may further specify the software or hardware entity performing the read or write operation. By storing the identity of the device issuing the read or write operation, the microprocessor can determine, using appropriate prioritization tables maintained by the microprocessor, whether a newly requested flash memory operation is of higher priority and, if so, the microprocessor may interrupt the flash controller causing it to abort the read or write operation to permit the higher priority flash memory operation to be immediately performed.

Additionally, the status registers may further store any indication of the status of a current read or write operation. For example, the status register may record the time at which a read or write command was forwarded to the flash memory array. Thus, the microprocessor can access the time value and determine therefrom when the command will likely be completed. If a write operation typically takes 100 clock cycles, the microprocessor can determine whether the pending write command was only recently issued or whether it has almost been completed. This may permit the microprocessor to determine whether to interrupt the flash controller to issue a higher priority write operation. Insofar as read operations are concerned, the status register may specify the number of wait cycles used in connection with the particular read operation. As can be appreciated, a wide variety of status information can be stored within a status register depending upon the preprogramming of the system. In general, a status information is provided to improve the overall efficiency of the system to permit a greater number of operations to be performed within a given period of time or to permit a lower clock rate to be used while still achieving the same number of operations per second.

Figure 6:
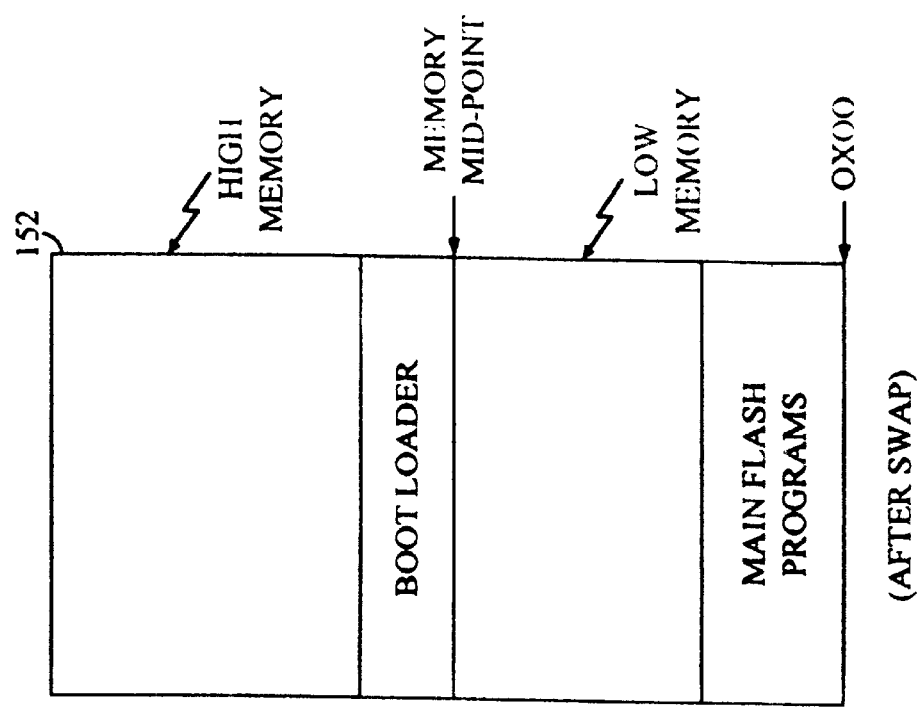
FIG. 6 is a block diagram of a partitionable memory space of the flash memory of FIG. 2.
Figure 6:
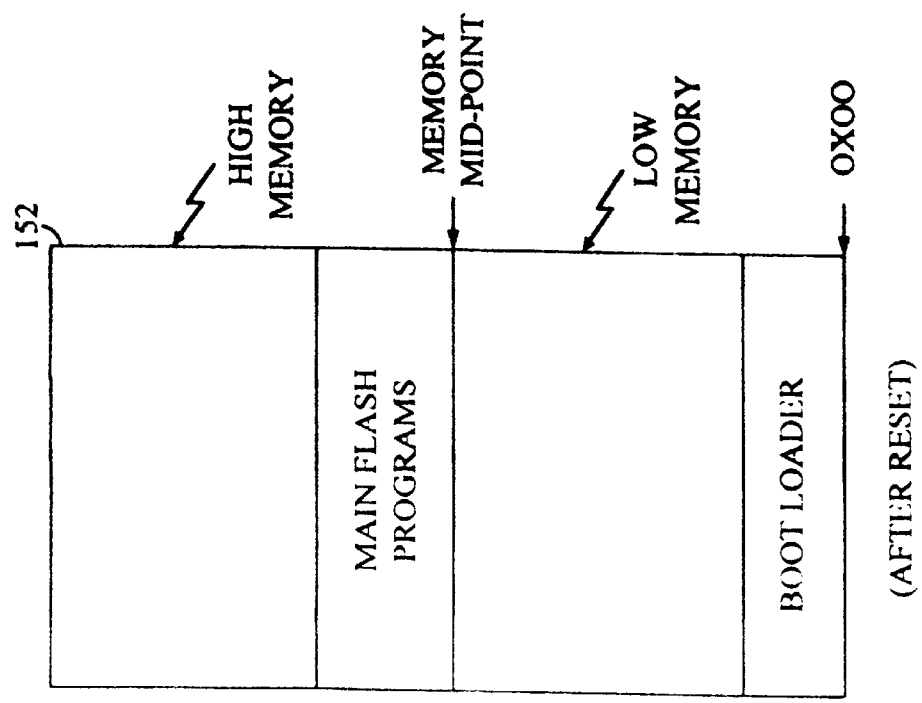

FIG. 6 illustrates the operation of the memory swap unit 149 (FIG. 2) which operates to swap high and low memory portions of an overall memory address space 152 of memory array 130 (also FIG. 2). In use, a boot loader is initially stored at a lowest memory address of the memory space, e.g., address 0x00. Main software programs are stored beginning at a high memory address such as 0x05800000. The boot loader includes commands specifying which of the main software programs within the flash memory need to be run as part of a power-up or reset operation. Once the boot loader has completed its operations, the memory swap unit swaps high and low memory. Thus, after the swap operation, the primary flash software programs are stored beginning at memory location 0x0. The boot loader is stored at a high memory address such as 0x05800000. Hence, a jump to low memory now allows entry into the main software of the flash macros. This permits the main flash software to be accessed more expediently. If thereafter, the cellular telephone is turned off and then turned back on again or if some other reset operation is performed, the memory addresses are again swapped such that the boot loader resides at the lowest memory address to permit proper initial operation of the boot loader.

The systems described herein may additionally incorporate a word-line buffer as described in copending U.S. patent application Ser. No. 09/465,664, entitled "Mobile Communication Device Having Flash Memory System with Word Line Buffer", filed Dec. 13, 1999.

What has been described are exemplary embodiments of a CDMA-based microprocessor system having an embedded flash and SRAM memory. Principles of the invention are applicable to other systems as well. The embodiments described herein are merely illustrative of the invention and should not be viewed as limiting the scope of the invention.

What is claimed is:

1. A method for accessing code stored within a flash memory system having a memory space partitionable into first and second memory partitions, with a boot loader stored beginning at lowest memory address of the first memory partition, said method comprising the steps of:

receiving a reset signal;

designating the first partition of the memory space as a low portion of memory and the second partition as a high portion of memory;

running the boot loader; and upon completion of the operations performed by the boot loader, swapping the first and second partitions of the memory space, such that any code stored within the second partition of the memory can thereafter be accessed from low memory.

2. The method of claim 1 wherein said step of running the boot loaded comprises the steps of:

determining whether any new code needs to be programmed within the flash memory and, if so, downloading the new code and then writing the new code into the high portion of memory before the first and second partitions are swapped.

* * * * *